US011107522B2

(12) United States Patent
El Gamal et al.

(10) Patent No.: US 11,107,522 B2
(45) Date of Patent: *Aug. 31, 2021

(54) MULTI-LEVEL CELL PROGRAMMING USING OPTIMIZED MULTIPHASE MAPPING WITH BALANCED GRAY CODE

(71) Applicant: Western Digital Technologies, Inc., San Jose, CA (US)

(72) Inventors: Mostafa El Gamal, Worcester, MA (US); Niranjay Ravindran, Rochester, MN (US); James Fitzpatrick, Laguna Niguel, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/912,588

(22) Filed: Jun. 25, 2020

(65) Prior Publication Data
US 2020/0327933 A1    Oct. 15, 2020

Related U.S. Application Data

(63) Continuation of application No. 16/219,825, filed on Dec. 13, 2018, now Pat. No. 10,734,071.

(51) Int. Cl.
*G11C 11/56*   (2006.01)
*H03K 23/00*   (2006.01)

(52) U.S. Cl.
CPC ...... *G11C 11/5628* (2013.01); *G11C 11/5642* (2013.01); *H03K 23/005* (2013.01);
(Continued)

(58) Field of Classification Search
CPC ............ G11C 11/5628; G11C 11/5642; G11C 2211/5644; G11C 2211/562;
(Continued)

(56) References Cited

U.S. PATENT DOCUMENTS

| 8,027,195 B2 | 9/2011 | Li et al. |
| 9,123,422 B2 | 9/2015 | Yu et al. |

(Continued)

OTHER PUBLICATIONS

Liu et al., "QLC NAND study and enhanced Gray coding methods for sixteen-level-based program algorithms," Microelectronics Journal, May 31, 2017, pp. 58-66, vol. 66, Elsevier Ltd.

*Primary Examiner* — Khamdan N. Alrobaie
(74) *Attorney, Agent, or Firm* — Morgan, Lewis & Bockius LLP

(57) ABSTRACT

Disclosed are systems and methods for providing programming of multi-level memory cells using an optimized multiphase mapping with a balanced Gray code. A method includes programming, in a first phase, a first portion of data into memory cells in a first-level cell mode. The method may also include reading, from the memory cells, the programmed first portion of the data. The method may also include programming, in a second phase, a second portion of the data into the memory cells in a second-level cell mode, wherein programming the second phase is based on applying, to the read first portion of the data, a mapping from the first-level cell mode to the second-level cell mode. The mapping may be selected based on minimizing an average voltage change of the memory cells from the first to second phase while maintaining a balanced Gray code.

20 Claims, 6 Drawing Sheets

(52) U.S. Cl.
CPC . *G11C 2211/562* (2013.01); *G11C 2211/5641* (2013.01); *G11C 2211/5644* (2013.01)

(58) Field of Classification Search
CPC .... G11C 2211/5641; G11C 2211/5621; H03K 23/005
See application file for complete search history.

(56) References Cited

U.S. PATENT DOCUMENTS

| | | |
|---|---|---|
| 9,697,892 B1 * | 7/2017 | Varanasi ................ G11C 29/52 |
| 9,715,939 B2 | 7/2017 | Ellis et al. |
| 9,830,983 B1 | 11/2017 | Hara et al. |
| 9,928,126 B1 | 3/2018 | Shappir et al. |
| 2006/0209592 A1 | 9/2006 | Li et al. |
| 2008/0285352 A1 * | 11/2008 | Cho ....................... G11C 16/10 |
| | | 365/185.18 |
| 2008/0285652 A1 | 11/2008 | Cho |
| 2009/0097313 A1 | 4/2009 | Park |
| 2011/0038207 A1 * | 2/2011 | Eun .................... G11C 11/5642 |
| | | 365/185.03 |
| 2014/0059406 A1 | 2/2014 | Hyun et al. |
| 2014/0108705 A1 | 4/2014 | Gorobets |
| 2015/0043276 A1 | 2/2015 | Sharon |
| 2015/0193302 A1 | 7/2015 | Hyun et al. |
| 2016/0085456 A1 | 3/2016 | Yamada |
| 2016/0125951 A1 | 5/2016 | Sun et al. |
| 2018/0293014 A1 | 10/2018 | Ravimohan |
| 2018/0366189 A1 | 12/2018 | Bedeschi |
| 2019/0304546 A1 | 10/2019 | Hsiao |

* cited by examiner

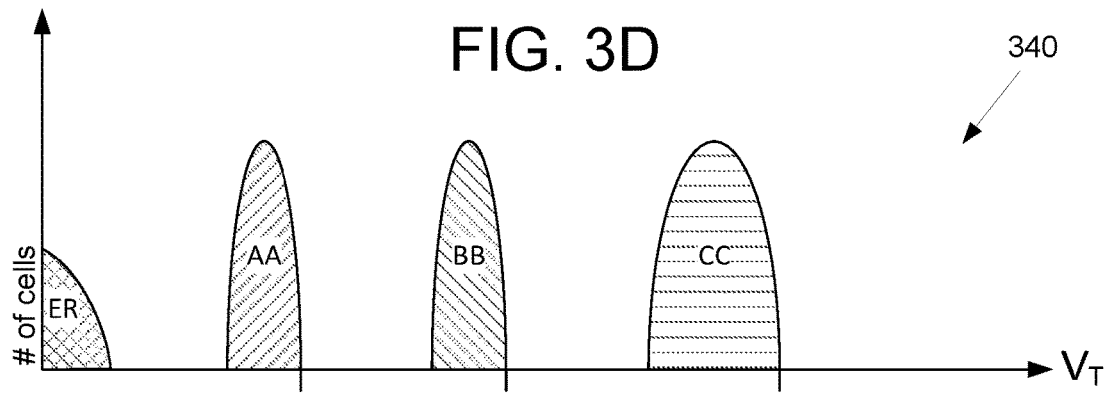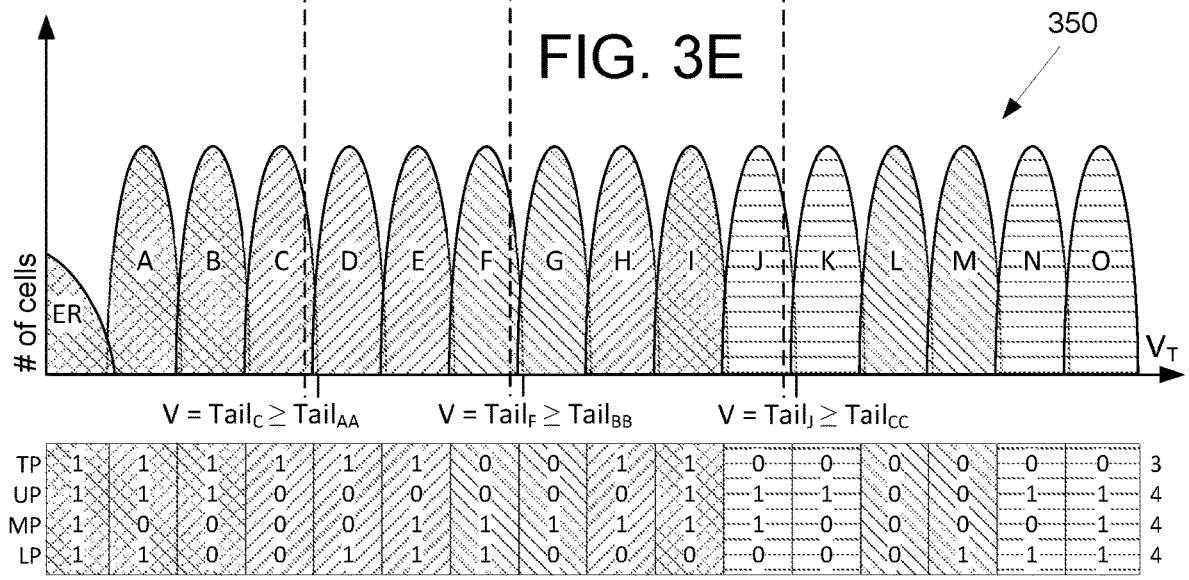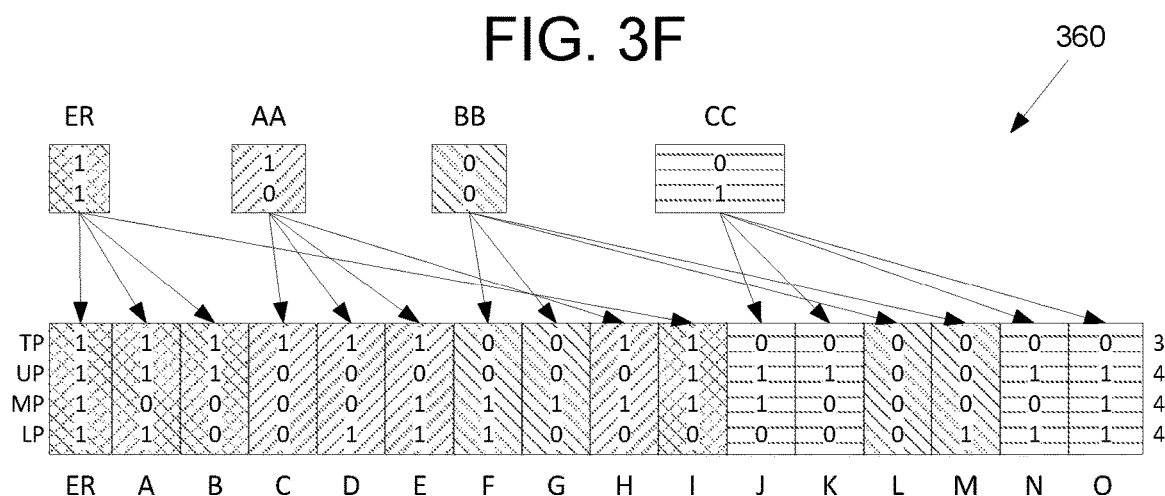

MULTI-LEVEL CELL PROGRAMMING USING OPTIMIZED MULTIPHASE MAPPING WITH BALANCED GRAY CODE

CROSS-REFERENCE TO RELATED APPLICATION

This application is a continuation of application Ser. No. 16/219,825, filed on Dec. 13, 2018, now U.S. Pat. No. 10,734,071, the entirety of which is incorporated herein by reference for all purposes.

BACKGROUND

The growing demand for high capacity storage devices has catalyzed the use of multi-level not and (NAND) flash memory cells, which include multi-level cells (MLC, 2 bits per cell), triple level cells (TLC, 3 bits per cell), quad level cells (QLC, 4 bits per cell), and higher capacities. As the number of bits stored in a memory cell increases, the level of precision required for reliable data programming also becomes stricter in tandem. Existing approaches for precise programming of multi-level cells may demand additional hardware resources, which increases the complexity and cost of the storage device while reducing available space for other productive uses. Thus, there is a need for a more efficient method of programming multi-level cells.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

A detailed description will be made with reference to the accompanying drawings:

FIGS. 3D, 3E and 3F illustrate examples of program distributions after a first programming phase in MLC mode using variable MLC state widths and a second programming phase in QLC mode using an optimized multiphase mapping with a balanced Gray code.

DETAILED DESCRIPTION

Figure 1A:
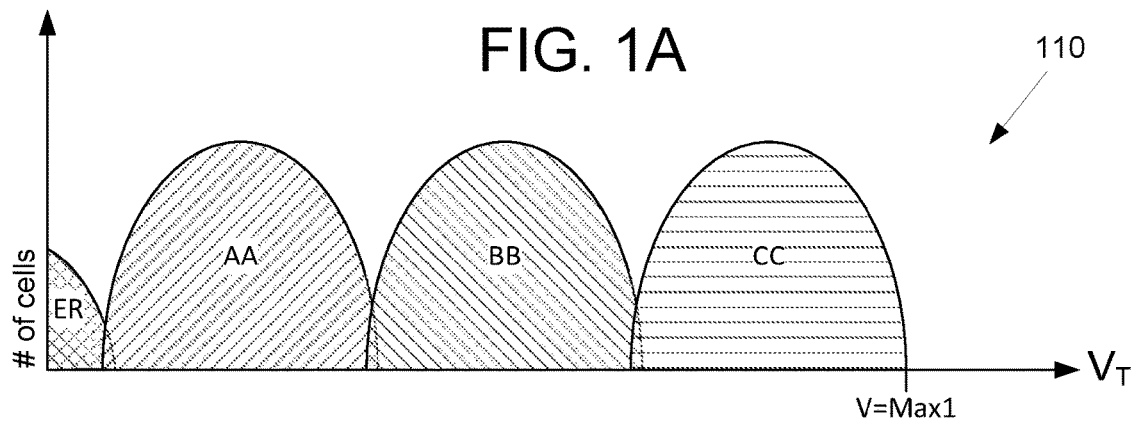
FIGS. 1A, 1B and 1C illustrate examples of program distributions after a first programming phase in MLC mode and a second programming phase in QLC mode using a multiphase mapping.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The present description relates in general to data storage systems and methods, and more particularly to, for example, without limitation, providing programming of multi-level memory cells using an optimized multiphase mapping with a balanced Gray code. Due to hardware and physical limitations among other factors, memory cells are often programmed into a limited voltage range, such as approximately 6.2 V. For multi-level cells with a large number of bits per cell, a corresponding large number of distributions needs to be programmed. For example, when including the erased state, QLC memory cells are programmed into 16 distributions corresponding to $2^4$ possible states for storing 4 bits of data within a limited voltage range, such as 6.2 V. It may not be feasible to precisely program these distributions in a single programming pass.

One approach to provide the required programming precision for multi-level cells is to use a foggy-fine programming approach. For example, when programming QLC memory cells, a first foggy phase may coarsely program 4 bits of data for each memory cell into wide overlapping distributions that are below target voltages, whereas a second fine phase may precisely program the same 4 bits of data for each memory cell to extend into narrower distributions containing the target voltages. However, since the QLC memory cells programmed in the first foggy phase may be unreadable due to the overlapping distributions, read disturb effects, and other factors, the data programmed in the first foggy phase also needs to be stored in an intermediate buffer so that the second fine phase can program the correct voltage difference.

One approach for providing such an intermediate buffer is to reserve high endurance memory, such as single level cells (SLC), as a cache for storing the foggy phase data. Using non-volatile memory can provide resilience against power failures to maintain data integrity, and may be more cost effective than using volatile random access memory. However, since SLC provides lower storage density and requires higher cost compared to multi-level memory cells, using SLC still increases the overall cost of the storage device and reduces available device space for other productive uses such as storing user data and overprovisioning. Accordingly, the capacity, endurance, performance, and cost effectiveness of the storage device may be limited when using a foggy-fine programming approach.

One or more implementations of methods and systems are provided for programming of multi-level memory cells using an optimized multiphase mapping with a balanced Gray code. In this approach, an optimal multiphase mapping is selected from candidate mappings to transition from a first phase of programming to a second phase of programming. The multiphase mapping may be selected based on finding a solution to an optimization problem, wherein the optimization minimizes an average voltage change of the states in the second phase from the first phase. This minimization helps to reduce the programming time for the second phase.

Further, the search scope of the optimization problem may be trimmed to include a second phase that results in a balanced Gray code, which helps to optimize the read speed of the programmed memory cells. A Gray code is an encoding wherein adjacent codes differ by only one bit, which enables more efficient error correction. Examples of a balanced Gray code are described later with reference to various figures.

In an example for programming QLC memory cells, a first phase programs the memory cells in a MLC mode. The target programming distributions in the first phase may be configured such that the memory cells are readable after programming, and may be adjusted to target specific desirable characteristics. For example, narrow target distributions may enable reduced or no error correction when reading, whereas wider target distributions may enable faster programming during the first phase.

As the memory cells are readable after the first phase, the second phase can read the programmed data directly from the memory cells in preparation for programming the memory cells in a QLC mode. By using the selected multiphase mapping, the correct voltage difference can be determined to program the memory cells from their MLC states into their final QLC states. As a result, this approach enables the omission of a buffer or cache to store the data programmed during the first phase, which helps to simplify storage device design and frees device space for other productive uses such as storing user data or overprovisioning.

One or more implementations of the subject technology provide several performance benefits that improve the functionality of a computer. As discussed above, a foggy-fine programming approach requires a buffer or cache to be reserved on the device, which in turn reduces space available for other productive purposes. Since the described multiphase programming procedure can read back the data directly from the programmed memory cells, the buffer or cache can be omitted, thereby reclaiming device space for user data, overprovisioning, or other purposes. High endurance non-volatile memory suitable for the cache, such as SLC memory cells, can be expensive, and thus the omission of the cache may help to improve the cost effectiveness of the storage device. Additionally, by using the reclaimed device space for user data, overprovisioning, or other purposes, various performance metrics of the storage device can be improved, such as write endurance, read/write bandwidth, read/write latency, and/or storage capacity. In turn, a host computer coupled to the storage device also receives the benefits of the storage device's improved performance.

Further, as discussed above, the multiphase mapping may be optimized to minimize an average voltage change between phases, which in turn reduces programming time. The target distributions for the first phase can be adjusted to be narrow to reduce or eliminate error correction, or alternatively the target distributions can be adjusted to provide wider voltage tolerances. In either case, the programming time can be reduced to improve the write performance of the storage device.

Figure 1B:
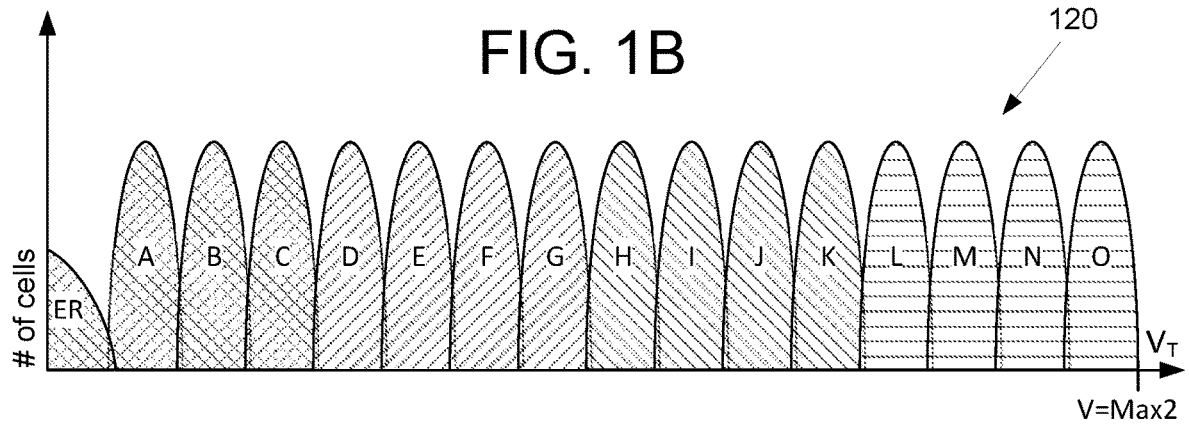
Figure 1C:
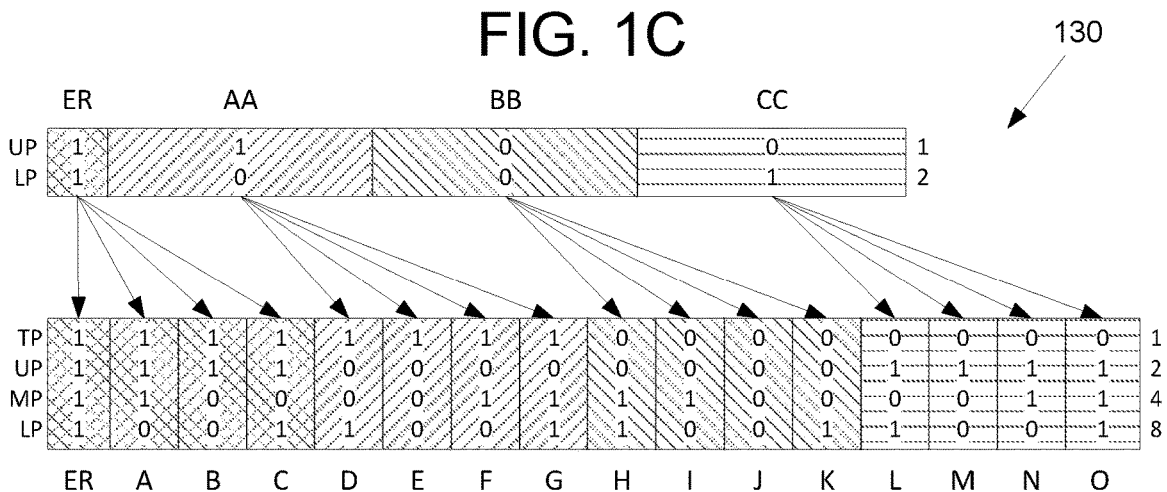

FIGS. 1A, 1B and 1C illustrate examples of program distributions after a first programming phase in MLC mode and a second programming phase in QLC mode using a multiphase mapping. FIG. 1A includes distribution 110, FIG. 1B includes distribution 120, and FIG. 1C includes mapping 130. While the example illustrated in FIGS. 1A, 1B, and 1C demonstrate a MLC to QLC mapping, it should be understood that the described techniques are generally applicable to multiphase programming of multi-level memory cells with various numbers of bits per cell. Thus, one or more aspects of the present technology may utilize memory cells with any number of states.

Distribution 110 of FIG. 1A may represent a voltage distribution after programming a first phase, wherein QLC memory cells are programmed in a MLC mode. As shown in distribution 110, four distributions corresponding to the erased state (ER, mapped to "11"), first state (AA, mapped to "10"), second state (BB, mapped to "00"), and third state (CC, mapped to "01") are programmed into a voltage range from 0 to Max1 volts. Max1 may be set to approximately 5 volts, for example. Programming of the first phase may use any suitable MLC programming technique. For example, programming and verify pulses may be alternated until the last verify pulse indicates that all of the programmed memory cells meet or exceed the program verify voltage for the desired program state. As shown in distribution 110, the MLC mode uses a 1-2 Gray code, wherein the upper page (UP) has one transition (between the AA and BB states) and the lower page (LP) has two transitions (first between the ER and AA states, and second between the BB and CC states).

FIG. 1B may represent a voltage distribution after programming a second phase, wherein the QLC memory cells programmed in FIG. 1A are extended into a QLC mode. As shown in distribution 120, the voltage range widens to Max2, which may be approximately 6.2 volts, for example. Sixteen (16) distributions are present in distribution 120, which correspond to the erased state (ER, mapped to "1111"), first state (A, mapped to "1110"), second state (B, mapped to "1100"), and so forth until the fifteenth state (O, mapped to "0111"). As shown in distribution 110 and 120, QLC states are indicated with the same shading as their respective MLC states prior to the second phase. For example, QLC states "ER", "A", "B" and "C" that are extended from the MLC state "ER" all share the same diagonal cross shading.

To extend distribution 110 into distribution 120, the second phase of programming may begin by reading the existing programmed data in the memory cells after the first phase, or the MLC bits (UP and LP), which correspond to the upper QLC bits (TP and UP). Note that the mapping of the MLC bits to the upper QLC bits is arbitrarily chosen for mapping 130, and alternative mappings may be used. According to the 4 data bits to be programmed in each memory cell, for example according to data from a write operation, mapping 130 can be used to determine how much additional voltage, if any, needs to be programmed into each memory cell to extend the original MLC state into a final QLC state.

For example, in one approach, if the data to be programmed into a particular memory cell corresponds to the bits "1000" and a read of the particular memory cell determines a read voltage within the MLC "10" distribution or MLC state "AA", then according to mapping 130, the final state mapping to "1000" corresponds to QLC state "E", which has a target voltage corresponding to the middle of a voltage distribution for the QLC state "E". Thus, the additional voltage to program can be determined from a difference between the target voltage and the determined read voltage.

For illustrative purposes, mapping 130 in FIG. 1C directly maps each MLC state in the first phase into 4 adjacent QLC states in the second phase. As shown in mapping 130, this results in an unbalanced 1-2-4-8 Gray code. Thus, 8 state transitions are present in the QLC lower page (LP), causing long read times to be incurred to distinguish between the 8 state transitions. To avoid this undesirable characteristic, an optimal mapping can be determined that provides a balanced Gray code to minimize state transitions for all memory pages.

Figure 2:
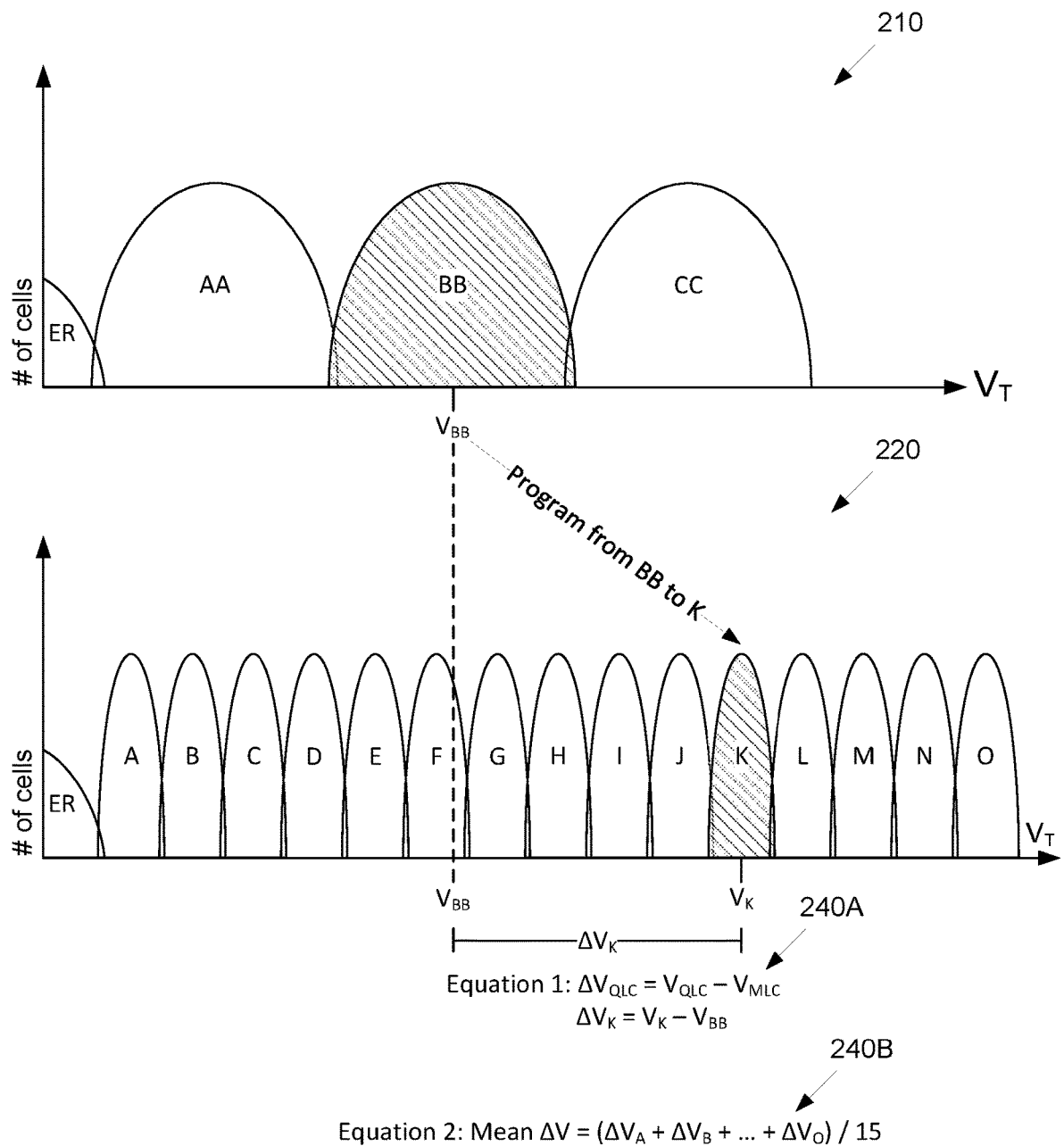
FIG. 2 illustrates an example of calculating an average voltage change between program distributions after a first and second programming phase using a multiphase mapping.

FIG. 2 illustrates an example of calculating an average voltage change between program distributions 210 and 220 after respective first and second programming phases using a multiphase mapping. Distribution 210 is for the first phase and may correspond to distribution 110. Distribution 220 is for the second phase and may correspond to distribution 120. FIG. 2 also includes formula 240A and formula 240B for respective equations 1 and 2. A first phase may be in a first-level cell mode (e.g., an MLC mode). A second phase may be in a second-level cell mode (e.g., a QLC mode).

A voltage change for each QLC state in distribution 220 for the second phase can be calculated with respect to its original MLC state in distribution 210, as illustrated by formula 240A. As shown in FIG. 2, the middle of each state distribution is the assumed voltage for each state distribution. Thus, $V_{BB}$ is the voltage in the middle of the MLC state "BB" distribution, and $V_K$ is the voltage in the middle of the QLC state "K" distribution. For purposes of illustration, only MLC state "BB" and QLC state "K" are shaded in FIG. 2. The mapping between QLC states and their respective original MLC states can be determined by a mapping, such as mapping 130.

For example, a voltage change for QLC state "K" can be calculated using formula 240A, or $\Delta V_K = V_K - V_{BB}$. The value $\Delta V_K$ is the additional programming voltage used in the second phase to extend from MLC state "BB" in the first phase to QLC state "K" in the second phase. Since programming time is directly proportional to programming voltage, a smaller voltage change is desirable to reduce programming time, which in turn increases write performance by increasing write bandwidth and reducing write latency.

By applying formula 240A to each of the QLC states in distribution 220, the voltage change for each of the 15 QLC states can be determined. Note that MLC state ER to QLC state ER can be omitted as no programming takes place in this case. Once all of the voltage change values are determined, an average voltage change or mean $\Delta V$ can be determined using formula 240B. As discussed above, minimizing voltage change is desirable to improve programming time and write performance. Thus, to determine an optimal mapping, one optimization criteria may correspond to minimizing the average voltage change or mean $\Delta V$.

Specifically, as indicated by formula 240B, minimizing the average voltage change may include determining a total voltage change caused by the second phase. The total voltage change may be calculated by adding together all of the voltage changes of the programming levels in a second-level cell mode (e.g., for a QLC mode shown in FIG. 2, adding the voltage changes for the QLC states "A" through "O" in distribution 220). This total voltage change is then divided by the maximum number of programming levels in the second-level cell mode, or 15 for a QLC mode, to determine the average voltage change.

It is desirable to minimize this average voltage change, for example, by satisfying a threshold voltage range. In one example, the threshold voltage range may correspond to greater than 0 but less than or equal to 1.2 volts. In another example, the threshold voltage range may correspond to greater than 0 but less than or equal to 1.4 volts. In yet another example, the threshold voltage range may correspond to greater than 0 but less than or equal to 1.6 volts. While 1.2, 1.4, and 1.6 volts are provided as sample upper ranges, another voltage may be selected for the upper range.

Alternatively, rather than using absolute values, the upper range of the threshold voltage range may correspond to a percentage of the maximum voltage range in the second phase. For example, the upper range may correspond to 25% of the maximum voltage range in the second phase. Using distribution 320 in FIG. 3B as an example, the upper range corresponds to 25% of Max4. While 25% is provided as one example percentage, the percentage may be selected from other values, such as 20%, 15%, and 10%.

Note that formula 240B provides an equal weighting for each of the voltage change values associated with QLC states "A" through "O". One or more aspects of the present technology may utilize individual weights for one or more of the voltage change values in formula 240B. For example, if an analysis of data patterns for a particular application indicates that the QLC state "O" tends to be written with a greater frequency compared to the other QLC states, then the voltage change value associated with the QLC state "O" may be scaled accordingly using a weight coefficient.

FIG. 2 illustrates the calculation of average voltage change or mean $\Delta V$, which can be used as one optimization criterion for selecting an optimal mapping from candidate mappings. For example, to determine mapping 330 in FIG. 3C, mapping 330 may be selected from a list of candidate mappings based on finding a solution to an optimization problem, as discussed in further detail below. One optimization criterion may be to select a mapping wherein an average voltage change of the mapping satisfies a threshold voltage range, as discussed above.

The threshold voltage range may also be based on the available candidate mappings. For example, the threshold voltage range may include candidate mappings having the 10% lowest average voltage change values, while excluding the remaining 90%. Of course, different percentages may be used. In another example, the threshold voltage range may include candidate mappings that do not exceed a predetermined value or percentage deviation of an estimated best candidate having an estimated smallest average voltage change. Other criteria for satisfying the threshold voltage range may be applied based on heuristics, statistical analysis, sorting, and other approaches.

Figure 3A:
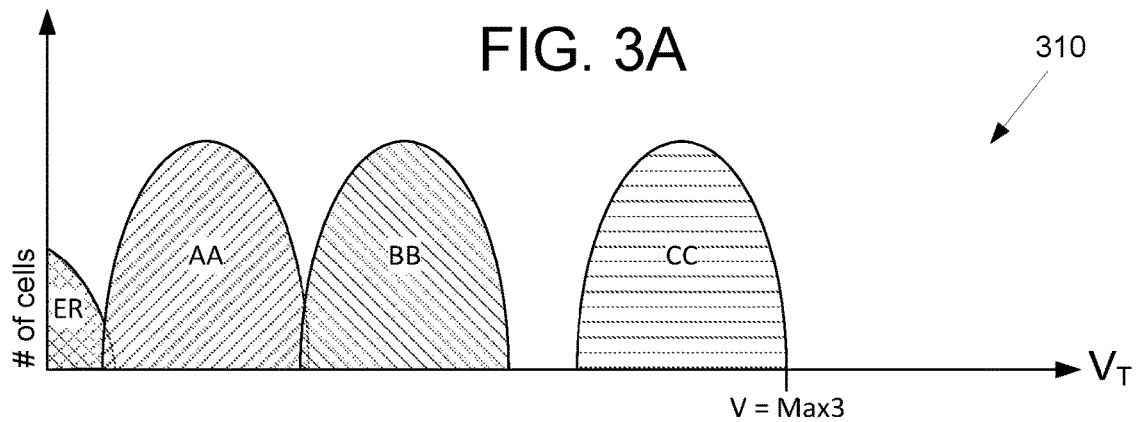
FIGS. 3A, 3B and 3C illustrate examples of program distributions after a first programming phase in MLC mode and a second programming phase in QLC mode using an optimized multiphase mapping with a balanced Gray code.
Figure 3B:
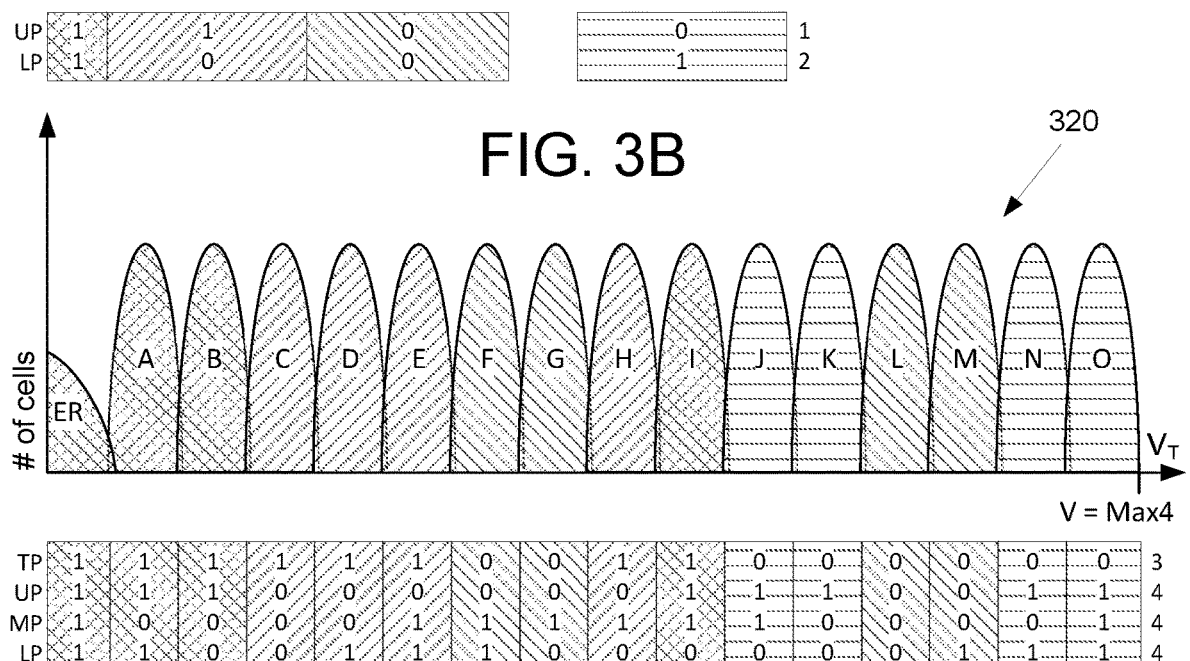
Figure 3C:
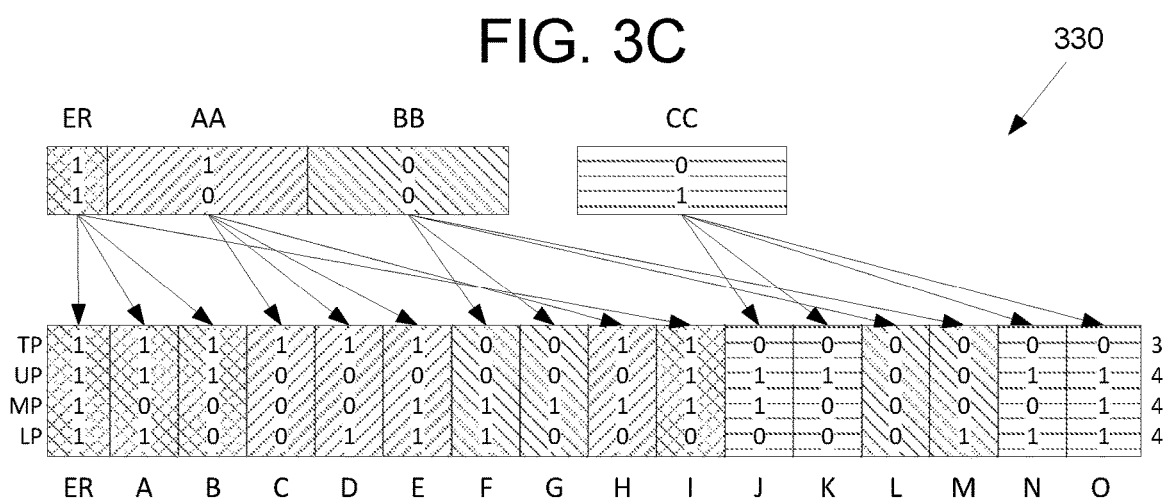

Other optimization criteria and restraints may also be used to further optimize the selected mapping. For example, one restraint may specify that the mapping provides a balanced Gray code. FIG. 3A-3C present an example mapping 330 that provides such an optimized mapping with a balanced Gray code.

FIGS. 3A, 3B and 3C illustrate examples of program distributions after a first programming phase in MLC mode and a second programming phase in QLC mode using an optimized multiphase mapping with a balanced Gray code. FIG. 3A includes distribution 310, FIG. 3B includes distribution 320, and FIG. 3C includes mapping 330. As with FIGS. 1A, 1B and 1C, a MLC to QLC mapping is specifically demonstrated but one or more aspects of the present technology may utilize memory cells with any number of states.

Comparing the non-optimized examples shown in FIG. 1A-1C to the optimized examples shown in FIG. 3A-3C, various differentiating factors can be observed. For example, the distributions or widths of the MLC states are narrower in distribution 310 compared to distribution 110. More specifically, while the MLC state widths are approximately four (4) QLC state widths in distribution 110, the MLC state widths are approximately three (3) QLC state widths in distribution 310. Thus, the width of the distribution for a MLC state in distribution 310, such as MLC state "CC", is less than the sum of the width of the distributions for the corresponding four (4) mapped QLC states, or QLC states "J", "K", "N", and "O". Narrower distributions may correspond to longer programming times due to the higher programming precision. Conversely, wider distributions may correspond to faster programming times. In this case, the width of the distribution for a MLC state may be greater than the sum of the width of the distributions for the corresponding mapped QLC states.

Further, as shown in FIG. 3A, the voltage range for the first phase, or Max3 in distribution 310, may also be reduced when compared to distribution 110. For example, Max3 may be approximately 4.2 volts, which is less than the 5.0 volts of Max1. Since the MLC state widths are narrower in distribution 310, the voltage range may also be reduced in tandem. Alternatively, the narrower MLC distributions may enable further spacing apart of state distributions in distribution 310, which may result in maintaining the same voltage range (Max1=Max3) or increasing the voltage range (Max3>Max1). Similarly, if a wider MLC distribution was selected for distribution 310, then Max3 may be larger than Max1, such as 5.5 volts, for example, to accommodate the wider state distributions.

On the other hand, the voltage range for the second phase may be maintained for both distribution 120 and distribution 320, wherein Max4 is also set to 6.2 volts (Max2=Max4). Maintaining the voltage range of the second phase may be preferable to avoid reducing the width of the QLC state distributions, which in turn maintains reading speed of data in distribution 320.

While narrower distributions may require higher precision for programming, narrower distributions may also enable the distributions to be further spaced apart, which in turn enables less stringent error correction for accelerated read speeds. For example, while the MLC states in distribution 110 are adjacent to each other, MLC state "CC" in distribution 310 is separate and offset from the other MLC states. This allows memory cells programmed in the MLC state "CC" to be read quickly with minimal or no error correction. Thus, at least a subset of the data read in distribution 310 may be read with minimal or no error correction. The MLC state widths and positions can therefore be adjusted in various different configurations to attain corresponding performance benefits, as further discussed below in conjunction with FIG. 3D.

As previously discussed, mapping 130 corresponds to a simple mapping wherein each MLC state is directly mapped to four adjacent QLC states, resulting in an unbalanced Gray code. On the other hand, mapping 330 demonstrates an example optimized mapping that results in a balanced Gray code. As shown in mapping 330, each MLC state maps to four QLC states that are not necessarily adjacent to each other. However, as a constraint, since a NAND memory cell cannot be programmed to a lower voltage without erasing the entire flash block containing the memory cell, the MLC state to QLC state transitions in mapping 330 are constrained to maintain or increase voltages only. Thus, as shown in mapping 330, the state transitions do not move to the left, which would result in a decreased voltage. This positive voltage constraint will be discussed in greater detail in conjunction with the voltage tails described in FIGS. 3D, 3E, and 3F.

Note that the sum of the transition counts for all of the pages in mapping 330 corresponds to or does not exceed the maximum number of programming levels. For example, FIG. 3C illustrates a maximum of 16 QLC states (e.g., the ER, A, B, C, D, E, F, G, H, I, J, K, L, M, N, and O states).

In this example, the maximum number of programming levels for the QLC mode is 15 (e.g., 16-1=15). Here, the Gray code or the transition counts for the four pages are represented by 3-4-4-4, and the sum of the transition counts for all four pages in mapping 330 is 15 (3+4+4+4=15).

In one or more examples, a balanced Gray code may be satisfied when a difference between transition counts of any two pages of the memory pages does not exceed a predetermined transition count difference. The predetermined transition count difference may be one (1). For example, when examining the 3-4-4-4 Gray code of mapping 330, a difference can be calculated between the transition counts of any two pages selected from the top page (TP), upper page (UP), middle page (MP), and lower page (LP). This may include calculating the difference for each of the following memory page pairs: (1) TP and UP, (2) TP and MP, (3) TP and LP, (4) UP and MP, (5) UP and LP, and (6) MP and LP. When a Gray code is configured such that each of these differences does not exceed 1, then the Gray code is a balanced Gray code.

For example, for a 3-4-4-4 Gray code, the TP has 3 transition counts, the UP has 4 transition counts, the MP has 4 transition counts, and the LP has 4 transition counts. The difference between the transition counts of TP and UP is 1. The difference between the transition counts of TP and MP is 1. The difference between the transition counts of TP and LP is 1. The difference between the transition counts of UP and MP is 0. The difference between the transition counts of UP and LP is 0. The difference between the transition counts of MP and LP is 0. Thus, for all the memory page pairings of the memory pages, the difference between the transition counts does not exceed 1, and the 3-4-4-4 Gray code is therefore balanced.

In one or more examples, a balanced Gray code may also be satisfied when a difference between transition counts between every two adjacent pages of the memory pages does not exceed a predetermined transition count difference. The predetermined transition count difference may be one (1). For example, when examining the 3-4-4-4 Gray code of mapping 330, a difference can be calculated between the transition counts of every two adjacent pages, such as (1) top page (TP) and upper page (UP), (2) upper page (UP) and middle page (MP), (3) middle page (MP) and lower page (LP), and (4) lower page (LP) and top page (TP). In this example, LP and TP are a wraparound pair and thus, they are considered to be two adjacent pages. When a Gray code is configured such that each of these differences does not exceed 1, then the Gray code is a balanced Gray code.

For example, for a 3-4-4-4 Gray code, the TP has 3 transition counts, the UP has 4 transition counts, the MP has 4 transition counts, and the LP has 4 transition counts. The difference between the transition counts of TP and UP is 1. The difference between the transition counts of UP and MP is 0. The difference between the transition counts of MP and LP is 0. The difference between the transition counts of LP and TP is 1. Thus, for every two adjacent pairings of the memory pages, the difference between transition counts does not exceed 1, and the 3-4-4-4 Gray code is therefore balanced. Thus, the 3-4-4-4 Gray code of mapping 330 is a balanced Gray code.

A balanced Gray code enables faster read operations since the maximum number of transitions to distinguish for each memory page is minimized. For example, when using a 3-4-4-4 balanced Gray code, the read operation distinguishes up to four (4) transitions for each memory page. Accordingly, the read operation does not bottleneck on any particular memory page having a significantly higher number of transitions relative to the other memory pages, such as with the 8 transition count of the lower page (LP) in mapping 130.

In mapping 330, the mappings from the MLC states to the QLC states may be chosen such that the average voltage change or mean ΔV is minimized, as discussed in conjunction with FIG. 2 above, while being constrained to provide a balanced Gray code, as discussed immediately above. Specifically, one way to approach this selection is to solve an optimization problem, wherein the candidates correspond to various possible multiphase mappings, and the optimization criteria include minimizing the average voltage change while adhering to the constraint of providing a balanced Gray code.

To solve the optimization problem, various algorithms such as dynamic programming, linear programming, heuristic searches, Monte Carlo algorithms, and other approaches may be used to obtain a solution. Further, the search space may be pruned to exclude solutions with unbalanced codes, so that only balanced Gray codes remain. Since the number of candidate solutions may still be large, such as 500,000, testing and validating the various candidates may take significant time. For example, it may be desirable to test the candidates under real world operating conditions to confirm anticipated performance.

Figure 5:
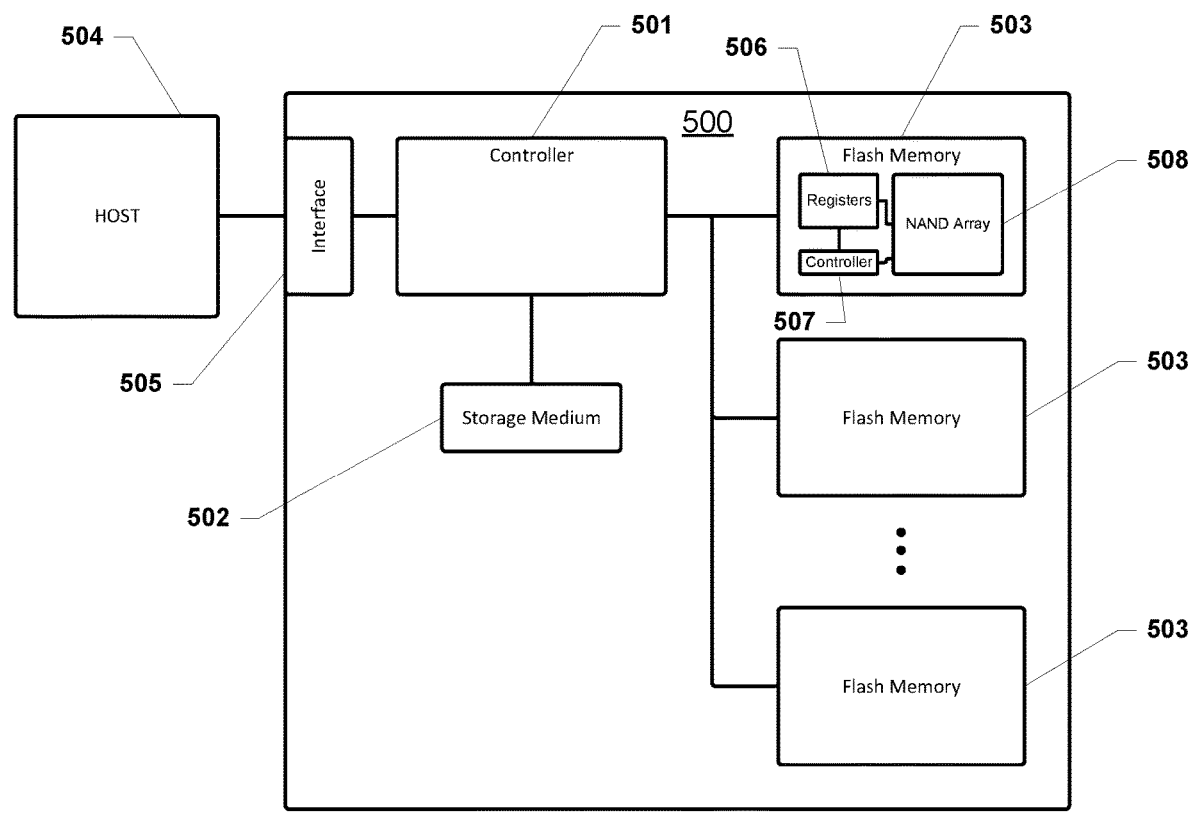
FIG. 5 is a block diagram illustrating components of an example data storage system.

Once a particular solution has been determined and validated as having the desired performance characteristics, the mapping can be stored as a predetermined value for use by a storage device or memory controller, such as data storage system 500 or controller 507 in FIG. 5. The example mapping shown in mapping 330 corresponds to one such validated solution. Thus, finding a mapping only incurs a one-time pre-processing computation that does not need to be executed by the controller.

FIGS. 3D, 3E and 3F illustrate examples of program distributions after a first programming phase in MLC mode using variable MLC state widths and a second programming phase in QLC mode using an optimized multiphase mapping with a balanced Gray code. FIG. 3D includes distribution 340, FIG. 3E includes distribution 350, and FIG. 3F includes mapping 360. As with FIGS. 1A, 1B and 1C, a MLC to QLC mapping is specifically demonstrated but one or more aspects of the present technology may utilize memory cells with any number of states.

As shown in distribution 340, the voltage distributions can be variable width and may not be uniform width for all of the MLC states. For example, the MLC states "AA" and "BB" have a narrower distribution compared to the MLC state "CC". Further, the use of narrower distributions allows the MLC states in distribution 340 to be separated by larger margins. Thus, error correction can be reduced or eliminated when reading memory cells programmed according to distribution 340. Conversely, if the MLC states use wider distributions, then programming speed can be increased at the cost of increased error correction. As the benefits from selecting wider versus narrower MLC distributions may represent various tradeoffs, the MLC state distribution widths may be tailored according to measured performance, application use cases, device firmware, hardware constraints, ease of implementation, or other criteria.

In distribution 340, each MLC state after the ER state is identified as having a corresponding voltage tail, which identifies the maximum voltage for each respective voltage distribution. To adhere to the positive voltage constraint described previously, the voltage tail for the first mapped (leftmost) QLC state in distribution 350 should meet (align) or exceed (be positioned to the right of) the voltage tail of the corresponding MLC state in distribution 340. For example, observing the MLC state "AA", it can be seen that the first mapped QLC state corresponds to QLC state "C". Accordingly, the voltage tails to be compared are $Tail_{AA}$ and $Tail_C$. Since $Tail_C$ is equal to or greater than (aligns or exceeds) $Tail_A$, mapping 360 remains a valid mapping for MLC state "AA". Similar observations can be made for MLC states "BB" and "CC", as shown in distribution 350. This can be confirmed visually by the arrows in mapping 360 pointing down or right, but not to the left. A mapping that does not meet the positive voltage constraint for all MLC states can be determined to be invalid and removed from consideration.

Figure 4:
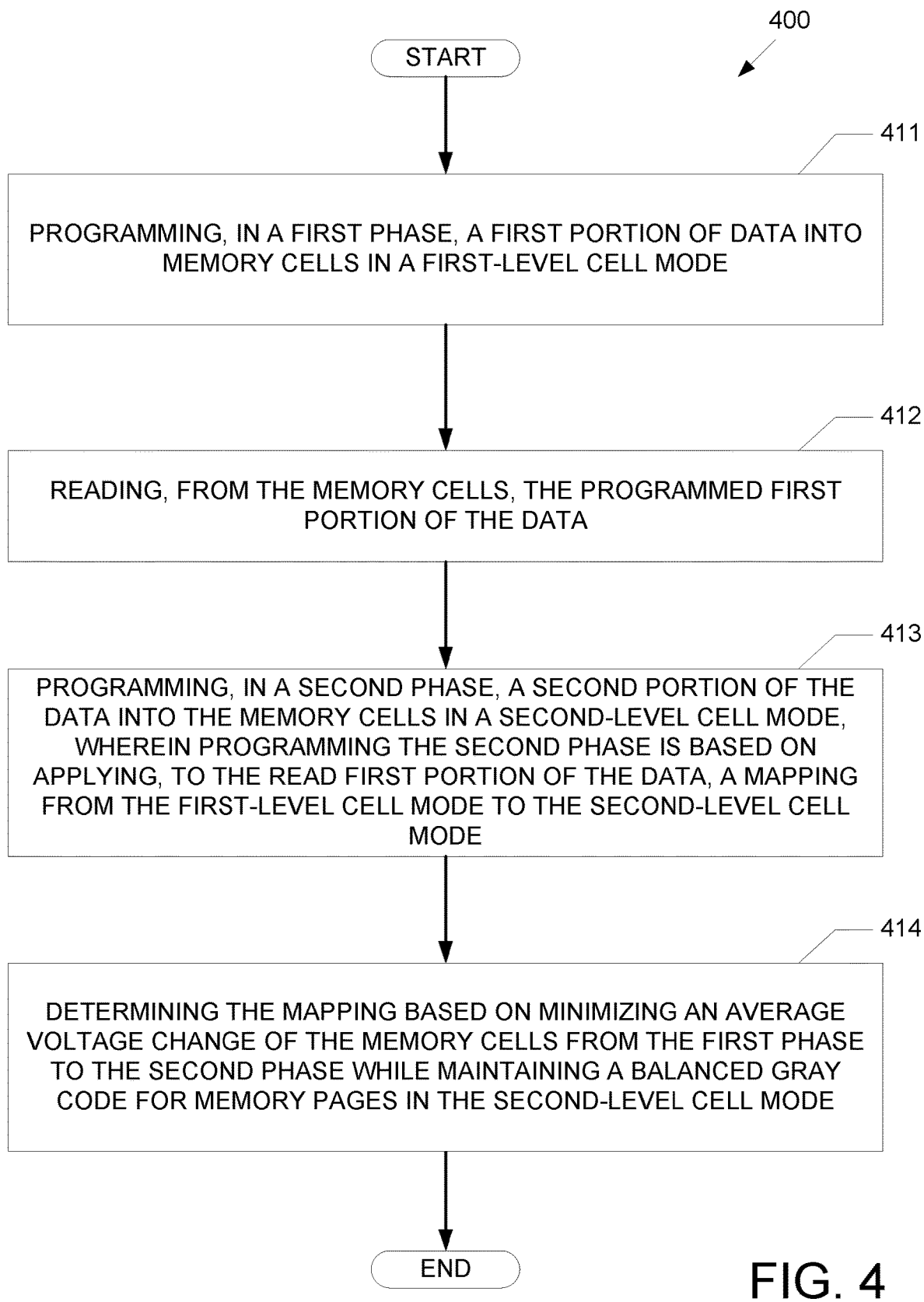
FIG. 4 is a flowchart illustrating an example process for programming multi-level memory cells using an optimized multiphase mapping with a balanced Gray code.

FIG. 4 is a flowchart illustrating an example process 400 for programming multi-level memory cells using an optimized multiphase mapping with a balanced Gray code. One or more blocks of FIG. 4 may be executed by a computing system (including, e.g., a controller of a flash memory, a data storage controller of a data storage system or a solid state storage device (SSD), a processor, or the like). Examples of a computing system or a controller may be controller 501 and/or 507. Similarly, a non-transitory machine-readable medium may include machine-executable instructions thereon that, when executed by a computer or machine, perform the blocks of FIG. 4. The steps of process 400 may be implemented as hardware/firmware or software.

In block 411, referring to FIG. 5, controller 507 programs, in a first phase, a first portion of data into NAND array 508 in a first-level cell mode. For example, controller 501 may first receive a data write operation from host 504. Controller 501 may then use a flash translation layer (FTL) to route the received data write operation to one or more flash memory 503 for processing by a respective controller 507. Referring to FIG. 5 and FIG. 3A, controller 507 may program, in a MLC mode, a first portion of data corresponding to the two most significant bits for each nibble (4 bits) of data in the write operation received from host 504. The selection of the most significant bits is arbitrary and any selection of bits may be used. The selected bits may then be mapped to the MLC upper page (UP) and the MLC lower page (LP) for programming into memory cells of NAND array 508. After controller 507 completes programming, the memory cells may be read as distribution 310.

In block 412, referring to FIG. 5, controller 507 reads, from NAND array 508, the first portion of data programmed in block 411. In this example, the first portion of data corresponds to the two most significant bits of each nibble in the data write operation. Since block 411 is programmed in a first-level cell mode or MLC mode rather than a foggy mode, the data can be read back directly from NAND array 508, thereby enabling a buffer or cache to be omitted for storing the first portion of data.

In block 413, referring to FIG. 5 and FIG. 3C, controller 507 programs, in a second phase, a second portion of the data into NAND array 508 in a second-level cell mode, wherein programming the second phase is based on applying, to the first portion of data read from block 412, mapping 330 from the first-level cell mode to the second-level cell mode. As shown in FIG. 3C, mapping 330 is from a MLC mode to a QLC mode. Referring to FIGS. 3A and 3B, the MLC upper pages (UP) and MLC lower pages (LP) read in block 412 are carried over to the QLC top pages (TP) and QLC upper pages (UP). Thus, based on the remaining bits in each nibble in the data write operation, or the two least significant bits in this example, the bits for the QLC middle pages (MP) and QLC lower pages (LP) can be determined. Based on the determined 4-bit codes, the matching QLC state can be determined and the corresponding voltage difference to program can be applied to each memory cell. Note that blocks 412 and 413 may be executed in a pipelined manner to avoid usage of an intermediate buffer or cache to store the read of block 412.

In block 414, referring to FIG. 5, controller 507 determines the mapping based on minimizing an average voltage change of the memory cells from the first phase (e.g., after programming in MLC mode) to the second phase (e.g., after programming in QLC mode) while maintaining a balanced Gray code for memory pages in the second-level cell mode (QLC mode). As discussed above, the mapping 330 may be selected from candidate mappings based on determining a solution to an optimization problem. Various algorithms are known for providing a solution to such optimization problems. As discussed above, a balanced Gray code can be ensured when adjacent memory pages or any two memory pages does not exceed a predetermined transition count difference, such as 1, and a sum of the transition counts for all of the memory pages does not exceed a maximum number of programming levels in the second-level cell mode (e.g. 15 for QLC). Mappings that do not meet these constraints may be pruned from the candidate mappings. The 3-4-4-4 Gray code of mapping 330 is one example of a balanced Gray code that may be selected as a solution to the optimization problem, which may be stored for use by controller 507. Thus, prior to block 413, the mapping of block 414 may be selected by an external system and stored for retrieval by controller 507.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory array 510 including one or more flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508. Registers 506 may also include one or more data latches coupled to flash memory 503.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Controller 507 may perform the operations identified in blocks 411-414. Controller 507 may cause the operations identified in blocks 411-414 to occur, or controller 501 may provide instructions to cause or facilitate controller 507 (and registers 506) to perform operations identified in blocks 411-414.

Various examples of aspects of the disclosure are described below. These are provided as examples, and do not limit the subject technology.

One or more aspects of the subject technology provide a data storage device that may include a flash memory and a controller. The controller may be configured to program, in a first phase, a first portion of data into the memory cells in a first-level cell mode. The controller may also be configured to read, from the memory cells, the programmed first portion of the data. The controller may also be configured to program, in a second phase, a second portion of the data into the memory cells in a second-level cell mode, wherein programming the second phase is based on applying, to the read first portion of the data, a mapping from the first-level cell mode to the second-level cell mode. The mapping may be based on minimizing an average voltage change of the memory cells from the first phase to the second phase while maintaining a balanced Gray code for memory pages in the second-level cell mode, wherein a difference between transition counts of any two pages of the memory pages does not exceed a predetermined transition count difference, and a sum of the transition counts for all of the memory pages does not exceed a maximum number of programming levels in the second-level cell mode.

In other aspects, methods are provided for programming multi-level memory cells using an optimized multiphase mapping with a balanced Gray code. According to some aspects, a method may include programming, in a first phase, a first portion of data into memory cells in a first-level cell mode. The method may also include reading, from the memory cells, the programmed first portion of the data. The method may also include programming, in a second phase, a second portion of the data into the memory cells in a second-level cell mode, wherein programming the second phase is based on applying, to the read first portion of the data, a mapping from the first-level cell mode to the second-level cell mode. The method may also include determining the mapping based on minimizing an average voltage change of the memory cells from the first phase to the second phase while maintaining a balanced Gray code for memory pages in the second-level cell mode, wherein the maintaining comprises having transition counts between every two adjacent pages of the memory pages not exceeding a predetermined transition count difference.

In further aspects, a system may include means for programming, in a first phase, a first portion of data into memory cells in a multi-level cell (MLC) mode without writing to a buffer separate from the memory cells. The system may also include means for reading, from the memory cells, the programmed first portion of the data. The system may also include means for programming, in a second phase, a second portion of the data into the memory cells in a quad-level cell (QLC) mode, wherein programming the second phase is based on applying, to the read first portion of the data, a mapping from the MLC mode to the QLC mode. The system may also include means for selecting the mapping from a plurality of candidate mappings based on means for minimizing an average voltage change of the mapping from the MLC mode to the QLC mode and means for maintaining a balanced Gray code for memory pages in the QLC mode.

Various implementations of the methods and systems for programming multi-level memory cells using an optimized multiphase mapping with a balanced Gray code provide several performance advantages that improve the functioning of the storage device. A host computer that interfaces with the storage device is also provided with improved functioning by operating the storage device with higher read and write performance and storage capacity. Thus, the described methods and systems provide performance benefits that improve the functioning of a storage device and a host computer.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage system, comprising:
   memory cells; and
   one or more controllers configured to cause:
      writing, in a first phase, a first data portion into the memory cells in a first-level cell mode; and
      writing, in a second phase, a second data portion into the memory cells in a second-level cell mode, based on a mapping between the first-level cell mode and the second-level cell mode,
   wherein:
      a difference between transition counts of any two pages of memory pages in the second-level cell mode does not exceed a transition count difference,
      a sum of the transition counts for the memory pages in the second-level cell mode does not exceed a maximum number of programming levels in the second-level cell mode,
      a number of transition counts for each page of multiple pages associated with the first phase is different from a number of transition counts for a corresponding page of multiple pages associated with the second phase, and
      the transition count difference is an integer.

2. The data storage system of claim 1,
wherein for the first phase, the one or more controllers are configured to cause writing the first data portion into the memory cells in the first-level cell mode, to provide a first set of significant bits for at least multiple pages of the memory cells, across a first voltage distribution having a first plurality of states, and
wherein for the second phase, the one or more controllers are configured to cause writing the first data portion of the memory cells in the second-level cell mode, to provide a second set of significant bits for pages corresponding to the at least multiple pages associated with the first phase, across a second voltage distribution having a second plurality of states.

3. The data storage system of claim 1, wherein the one or more controllers are configured to cause:
setting the memory cells into the first-level cell mode, to configure the memory cells in the first-level cell mode to store a first number of bits per cell;
setting the memory cells into the second-level cell mode, to configure the memory cells in the second-level cell mode to store a second number of bits per cell, wherein the second number of bits per cell is greater than the first number of bits per cell;
programming the memory cells in the first-level cell mode to provide a first voltage distribution having a first maximum voltage; and
programming the memory cells in the second-level cell mode to provide a second voltage distribution having a second maximum voltage,
wherein the second maximum voltage is greater than the first maximum voltage.

4. The data storage system of claim 1, wherein a width of a state distribution in the memory cells in the first phase is different from a sum of widths of corresponding state distributions in the memory cells in the second phase according to the mapping.

5. The data storage system of claim 1, wherein widths of state distributions of the memory cells in the first phase are not uniform.

6. The data storage system of claim 5, wherein the one or more controllers are configured to cause reading, from the memory cells, at least a subset of the written first data portion without using error correction.

7. The data storage system of claim 1, wherein the one or more controllers are configured to cause not storing the first data portion in a buffer separate from the memory cells.

8. The data storage system of claim 1, wherein the one or more controllers are configured to cause retrieving the mapping as a predetermined value stored in the data storage system.

9. The data storage system of claim 1,
wherein the mapping is based on minimizing an average voltage change of the memory cells from the first phase to the second phase while maintaining a balanced Gray code for the memory pages in the second-level cell mode, and
wherein minimizing the average voltage change comprises:
determining a total voltage change caused by the second phase with respect to all of the programming levels in the second-level cell mode;
dividing the total voltage change by the maximum number of programming levels in the second-level cell mode; and
determining that the divided total voltage satisfies a threshold voltage range.

10. The data storage system of claim 9, wherein determining the total voltage change comprises weighting at least one programming level of the programming levels.

11. A method, comprising:
writing, in a first phase, a first data portion into memory cells in a first-level cell mode; and
writing, in a second phase, a second data portion into the memory cells in a second-level cell mode, based on a mapping between the first-level cell mode and the second-level cell mode,
wherein:
a difference between transition counts of any two pages of memory pages in the second-level cell mode does not exceed a transition count difference,
a sum of the transition counts for the memory pages in the second-level cell mode does not exceed a maximum number of programming levels in the second-level cell mode,
a number of transition counts for each page of multiple pages associated with the first phase is different from a number of transition counts for a corresponding page of multiple pages associated with the second phase, and
the transition count difference is an integer.

12. The method of claim 11,
wherein for the first phase, writing the first data portion into the memory cells in the first-level cell mode causes providing a first set of significant bits for at least multiple pages of the memory cells, across a first voltage distribution having a first plurality of states, and
wherein for the second phase, writing the first data portion of the memory cells in the second-level cell mode causes providing a second set of significant bits for pages corresponding to the at least multiple pages associated with the first phase, across a second voltage distribution having a second plurality of states.

13. The method of claim 11, comprising:
setting the memory cells into the first-level cell mode, to configure the memory cells in the first-level cell mode to store a first number of bits per cell;
setting the memory cells into the second-level cell mode, to configure the memory cells in the second-level cell mode to store a second number of bits per cell, wherein the second number of bits per cell is greater than the first number of bits per cell;
programming the memory cells in the first-level cell mode to provide a first voltage distribution having a first maximum voltage; and
programming the memory cells in the second-level cell mode to provide a second voltage distribution having a second maximum voltage,
wherein the second maximum voltage is greater than the first maximum voltage.

14. The method of claim 11, wherein a width of a state distribution in the memory cells in the first phase is different from a sum of widths of corresponding state distributions in the memory cells in the second phase according to the mapping.

15. The method of claim 11, wherein widths of state distributions of the memory cells in the first phase are not uniform.

16. The method of claim 11, comprising retrieving the mapping as a predetermined value stored in a data storage system.

17. The method of claim 11,
wherein the mapping is based on minimizing an average voltage change of the memory cells from the first phase to the second phase while maintaining a balanced Gray code for the memory pages in the second-level cell mode, and wherein minimizing the average voltage change comprises:
  determining a total voltage change caused by the second phase with respect to all of the programming levels in the second-level cell mode;
  dividing the total voltage change by the maximum number of programming levels in the second-level cell mode; and
  determining that the divided total voltage satisfies a threshold voltage range.

18. An apparatus, comprising:
means for writing, in a first phase, a first data portion into memory cells in a first-level cell mode; and
means for writing, in a second phase, a second data portion into the memory cells in a second-level cell mode, based on a mapping between the first-level cell mode and the second-level cell mode,
wherein:
a difference between transition counts of any two pages of memory pages in the second-level cell mode does not exceed a transition count difference,
a sum of the transition counts for the memory pages in the second-level cell mode does not exceed a maximum number of programming levels in the second-level cell mode,
a number of transition counts for each page of multiple pages associated with the first phase is different from a number of transition counts for a corresponding page of multiple pages associated with the second phase, and
the transition count difference is an integer.

19. The apparatus of claim 18, comprising:
means for setting the memory cells into the first-level cell mode, to configure the memory cells in the first-level cell mode to store a first number of bits per cell;
means for setting the memory cells into the second-level cell mode, to configure the memory cells in the second-level cell mode to store a second number of bits per cell, wherein the second number of bits per cell is greater than the first number of bits per cell;
means for programming the memory cells in the first-level cell mode to provide a first voltage distribution having a first maximum voltage; and
means for programming the memory cells in the second-level cell mode to provide a second voltage distribution having a second maximum voltage,
wherein the second maximum voltage is greater than the first maximum voltage.

20. The apparatus of claim 18,
wherein for the first phase, the means for writing the first data portion into the memory cells in the first-level cell mode is configured to cause providing a first set of significant bits for at least multiple pages of the memory cells, across a first voltage distribution having a first plurality of states, and
wherein for the second phase, means for writing the first data portion of the memory cells in the second-level cell mode is configured to cause providing a second set of significant bits for pages corresponding to the at least multiple pages associated with the first phase, across a second voltage distribution having a second plurality of states.

\* \* \* \* \*